(12) United States Patent
Cheng

(10) Patent No.: US 10,121,045 B2
(45) Date of Patent: Nov. 6, 2018

(54) FINGERPRINT SENSOR ARRAY HAVING DUPLEX SENSOR CELLS

(71) Applicant: Silead (Cayman) Inc., Shanghai (CN)

(72) Inventor: Taiyi Cheng, Shanghai (CN)

(73) Assignee: SILEAD INC., Shanghai (CN)

( * ) Notice: Subject to any disclaimer, the term of this patent is extended or adjusted under 35 U.S.C. 154(b) by 337 days.

(21) Appl. No.: 15/174,851

(22) Filed: Jun. 6, 2016

(65) Prior Publication Data

US 2017/0330011 A1 Nov. 16, 2017

(30) Foreign Application Priority Data

May 10, 2016 (CN) .......................... 2016 1 0304310

(51) Int. Cl.
*G06K 9/00* (2006.01)
*H01L 27/146* (2006.01)
*G01R 27/26* (2006.01)

(52) U.S. Cl.
CPC ....... *G06K 9/0002* (2013.01); *G06K 9/00026* (2013.01); *H01L 27/14609* (2013.01); *G01R 27/2605* (2013.01)

(58) Field of Classification Search
CPC .................................................. H01L 27/14609
See application file for complete search history.

(56) References Cited

U.S. PATENT DOCUMENTS

| | | | |
|---|---|---|---|
| 5,325,442 A | 6/1994 | Knapp | |
| 5,953,441 A | 9/1999 | Setlak | |
| 8,598,555 B2 | 12/2013 | Guerrero et al. | |
| 9,898,639 B2 * | 2/2018 | Lee | G06K 9/0002 |
| 2017/0046555 A1 * | 2/2017 | Lee | G06K 9/0002 |
| 2017/0330014 A1 * | 11/2017 | Ramberg | G06K 9/0002 |
| 2018/0060636 A1 * | 3/2018 | Hong | G06K 9/00087 |
| 2018/0113346 A1 * | 4/2018 | Han | G02F 1/13338 |

* cited by examiner

*Primary Examiner* — Utpal Shah
(74) *Attorney, Agent, or Firm* — Haynes and Boone, LLP (57) ABSTRACT

A fingerprint sensing device comprises a substrate and an array of sensor cells formed over the substrate. The sensor cells are divided into multiple groups. Each group is associated with a group-identifiable signal. The sensor cells in each group are configured to transmit the group-identifiable signal of the respective group and are further configured to simultaneously receive the group-identifiable signals transmitted by the sensor cells in other groups. The group-identifiable signals are orthogonal with respect to each other.

20 Claims, 9 Drawing Sheets

FINGERPRINT SENSOR ARRAY HAVING DUPLEX SENSOR CELLS

PRIORITY

This claims the benefit of Chinese patent application serial No. 201610304310.1, entitled "Fingerprint Sensor Array Having Duplex Sensor Cells," filed May 10, 2016, herein incorporated by reference in its entirety.

TECHNICAL FIELD

The present disclosure generally relates to electronic devices capable of sensing events. More particularly, but not by way of limitation, the present disclosure relates to a sensing apparatus and a method of driving and sensing for the sensing apparatus, such as a fingerprint sensor, and a system thereof.

BACKGROUND

Figure 1:
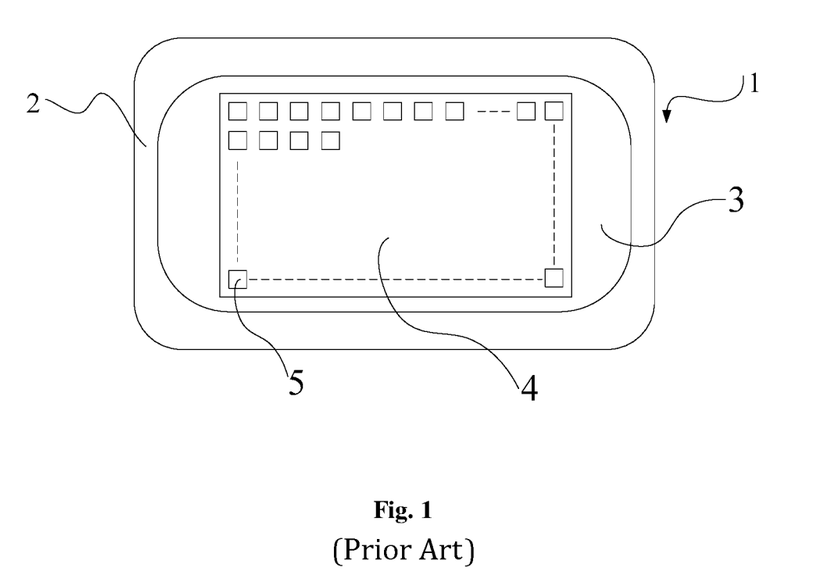
FIG. 1 is a top view of a fingerprint sensor.

FIG. 1 is a top view of a fingerprint sensor 1, which mainly includes the bezel 2, and a sensing part 3. The bezel 2 provides a strong outer alternating current (AC) signal. The sensing part 3 has control circuits, a sensor array 4 and so on. The sensor array 4 includes M×N sensor cells 5 which work as receiving cells of the AC signal.

Figure 2:
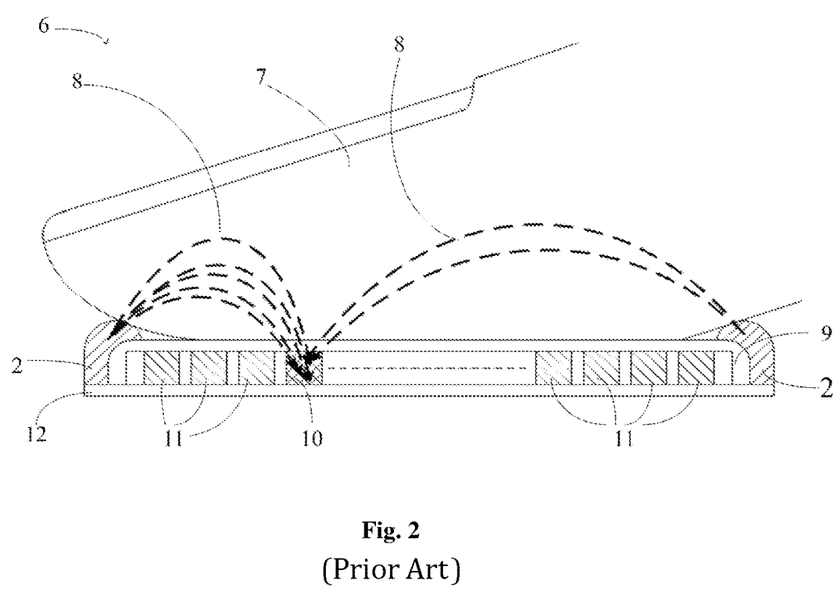
FIG. 2 is a cross-sectional view of the fingerprint sensor in FIG. 1, placed thereupon by a finger, illustrating the operation of the fingerprint sensor.

FIG. 2 is a sectional view 6 of the fingerprint sensor 1 illustrating its operation. A finger 7 touches the fingerprint sensor 1. An AC signal 8 from the bezel 2 passes through the finger 7 and a protective layer 9, and arrives at a scanning sensor cell 10. All of the sensor cells, including the scanning sensor cell 10 and other sensor cells 11, are on a substrate 12. Each of the sensor cells, 10 and 11, and the portion of the finger surface overlying the respective sensor cell form a capacitor. The capacitance of this capacitor varies depending on whether the respective finger surface is a ridge or a valley. A pattern of capacitor values can be obtained by driving the AC signal 8 through the finger 7 and measuring the variations of these capacitances at each sensor cell. A fingerprint image is thus obtained.

However, there are many disadvantages when the bezel 2 is used as a strong outer AC signal source. First, it increases the material cost of the fingerprint sensor 1 and the complexity of the manufacture processes. Second, it reduces the product yield of the fingerprint sensor. Third, when the whole module is integrated into an electronic device, such as being placed on a cellular phone or similar devices, the bezel 2 makes the industrial design (e.g., structure and outlook) of the device more difficult and may not match the device's mechanical requirement.

One approach to the above problem designates some sensor cells (e.g., sensor cells 11) as transmitting cells and some sensor cells (e.g., sensor cell 10) as receiving cells. A sensor cell either transmits or receives signals, but not both. Such approach suffers from slow frame rates as the cells have to switch between transmit and receive modes. Also, since only some cells transmit signals, such approach may not provide enough transmitting power, therefor lacking required sensitivity for certain fingerprint applications. Furthermore, direct coupling between the receiving cell and nearby transmitting cells can be problematic for such approach.

Accordingly, what is needed is improvement in the structure of the fingerprint sensor and the mechanism to implement the same.

SUMMARY

The present disclosure relates to devices, systems, and methods for sensing events. More particularly, the present disclosure relates to a capacitive sensing apparatus and a system thereof. An object of the present disclosure is to provide systems and methods for driving signals to and sensing outputs from a capacitive fingerprint scanner so as to increase its capacitance sensing accuracy without using a bezel for driving the signals.

According to an embodiment of the present disclosure, a fingerprint sensing device includes a substrate and an array of sensor cells disposed over the substrate. The sensor cells are placed into rows and columns to form a matrix. The sensor cells are divided into multiple groups and each group is associated with a group-identifiable signal. In an embodiment, these group-identifiable signals are orthogonal. Each sensor cell in a group transmits the group-identifiable signal of the respective group. At the same time, each sensor cell receives group-identifiable signals from other sensor cells. For example, a fingerprint sensing device may have eight (8) groups of sensor cells, each sensor cell transmits one group-identifiable signal and receives seven group-identifiable signals, and the eight group-identifiable signals are orthogonal. In various examples, there may be hundreds or thousands of sensor cells in each group. In an embodiment, the fingerprint sensing device further includes a controller integrated with the sensor cells, and designed to collect sensing events or capacitances reported by the sensor cells.

According to one aspect of the present disclosure, all sensor cells may transmit and receive at the same time. This provides many benefits. First, it provides greater total transmitting power, hence better sensitivity, than fingerprint sensing devices where only one or few sensor cells can transmit at a time. It achieves higher transmitting power without increasing the operating voltage of the fingerprint sensing device. Therefore, it is more suitable for human-machine interfacing applications. Second, it greatly enhances the fingerprint capture frame rates compared with other types of fingerprint sensing devices which scan the entire surface cell by cell. Third, since a sensor cell receives multiple scanning signals, it can assign weights to different signals, for example, based on a distance between itself and the signal source. This enables the sensor cell to selectively accept or reject signals for noise immunity purposes. Further, multiple orthogonal signals increase the fingerprint sensing device's reliability against environmental noises.

It is to be understood that both the foregoing general description and the following detailed description are exemplary and explanatory in nature and are intended to provide an understanding of the present disclosure without limiting the scope of the present disclosure. In that regard, additional aspects, features, and advantages of the present disclosure will be apparent to one having ordinary skill in the art from the following detailed description.

BRIEF DESCRIPTION OF THE DRAWINGS

The accompanying drawings illustrate embodiments of the systems and methods disclosed herein and together with the description, serve to explain the principles of the present disclosure.

DETAILED DESCRIPTION

For the purposes of promoting an understanding of the principles of the present disclosure, reference will now be made to the embodiments illustrated in the drawings, and specific language will be used to describe the same. It will nevertheless be understood that no limitation of the scope of the disclosure is intended. Any alterations and further modifications to the described devices, systems, methods, and any further application of the principles of the present disclosure are fully contemplated as would normally occur to one having ordinary skill in the art to which the disclosure relates. For example, the features, components, and/or steps described with respect to one embodiment may be combined with the features, components, and/or steps described with respect to other embodiments of the present disclosure to form yet another embodiment of a device, system, or method according to the present disclosure even though such a combination is not explicitly shown. Further, for the sake of simplicity, in some instances the same reference numerals are used throughout the drawings to refer to the same or like parts.

Figure 3:
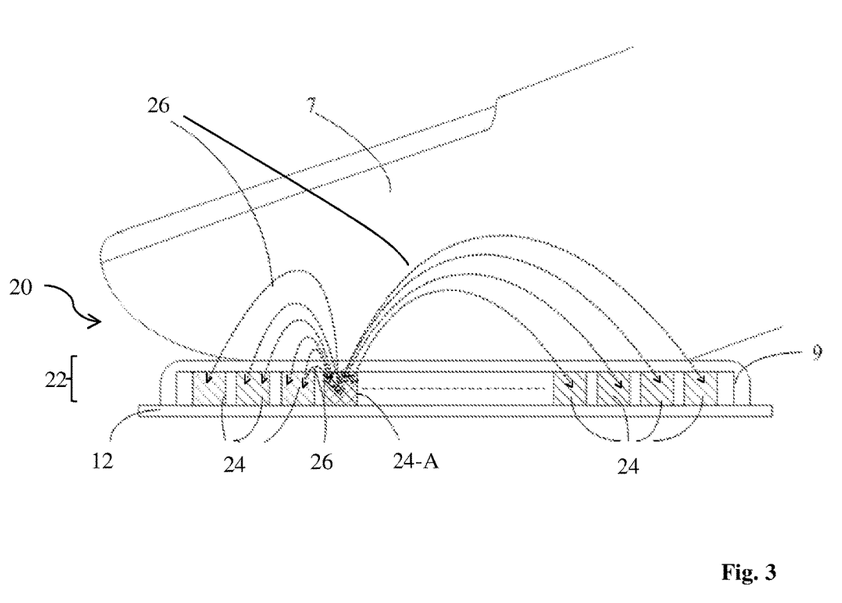
FIG. 3 is a cross-sectional view of a fingerprint sensor constructed in accordance with some embodiments of the present disclosure.

FIG. 3 is a sectional view of a fingerprint sensing device (or fingerprint sensor) 20, in portion, constructed in accordance with some embodiments of the present disclosure. Even though it is referred to as fingerprint sensor, it is not intended to limit the scope of the device. In various embodiments, it may be a touch panel to sense the touch positions or gestures, or a fingerprint scanner to sense the touch impression. In some embodiments, the fingerprint sensor 20 is a capacitive fingerprint sensor such as a single row of sensor cells 24 (e.g. a sweep scanner) or a two-dimensional array of sensor cells 24 (e.g. an area scanner). Each sensor cell 24 typically includes an active capacitive feedback circuit whose effective capacitance is decreased by the presence of a finger near the sensor cell 24. The amount of capacitance decrease is more for ridges and less for valleys, thereby allowing the user's fingerprint to be recorded or recognized.

The fingerprint sensor 20 includes a substrate 12, a sensing part 22 formed on the substrate 12, and a protective layer 9 formed on the sensing part 22.

The substrate 12 may be an insulating substrate, an integrated circuit (IC) substrate, a glass or quartz substrate, or other types of subtrate. The protective layer 9 may include barium titanate in a polymide matrix, thin films of oxide, nitride, carbide, glass, ceramic, sapphire, or other type of dielectric material. The sensing part 22 includes many sensor cells 24 configured in an array, such as an M×N or 1×N array.

Each sensor cell 24 is operable to transmit a signal 26 and receive multiple signals 26, as indicated by the bi-directional dotted arrows in FIG. 3. Therefore, each sensor cell 24 has a duplex working mode (hence a duplex sensor cell). The signals 26 in the transmitting and receiving directions (with respect to a sensor cell 24) are different. In an embodiment, the signals 26 at the transmitting and receiving directions are orthogonal, such as orthogonal in frequency or orthogonal in code. As illustrated in FIG. 3, a sensor cell 24-A receives signals from every other sensor cells and, at the same time, broadcasts its signal to every other sensor cells. These signals 26 go through the protective layer 9 and the finger 7, and reach the destination sensor cells 24. For the purposes of simplicity, not all the signals 26 are illustrated in FIG. 3.

At each sensor cell 24 (such as the sensor cell 24-A), the received signals 26 are weighted and summed into a composite signal. The composite signal is used to detect a capacitance between the sensor cell 24 and the finger 7. Compared with the fingerprint sensor 1 in FIGS. 1 and 2, the fingerprint sensor 20 does not use a bezel for transmitting an AC signal. Therefore, the fingerprint sensor 20 has a smaller footprint. Further, the signals 26 generally have shorter transmission path than the signals 8 in FIG. 2. This helps enhance the sensitivity and reliability of the fingerprint sensor 20 over the fingerprint sensor 1.

Figure 4:
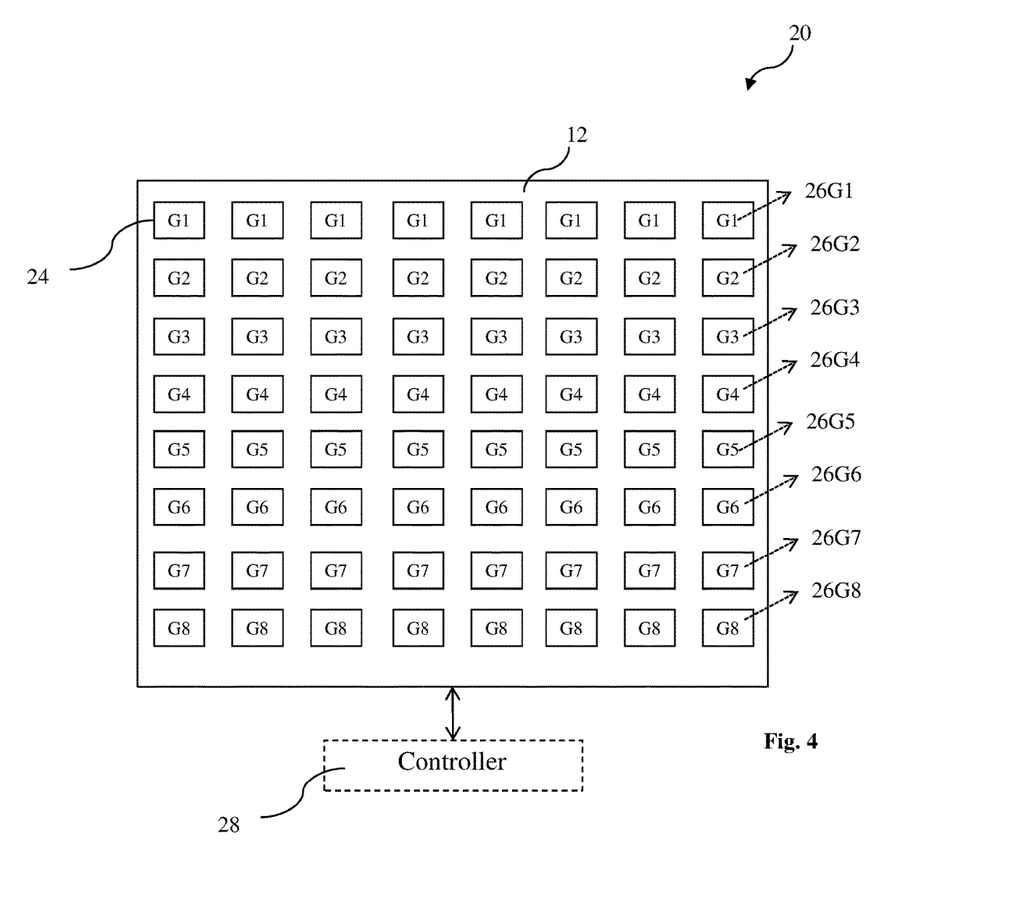
FIG. 4 is a top view of the fingerprint sensor in FIG. 3 constructed in accordance with some embodiments of the present disclosure.

FIG. 4 illustrates a top view of the fingerprint sensor 20, in portion, in accordance with some embodiments. Referring to FIG. 4, the fingerprint sensor 20 includes a plurality of sensor cells 24 formed over the substrate 12. The sensor cells 24 are configured in an array. In the embodiment shown, the array has eight rows and eight columns (an 8×8 array). In various embodiments, the array may have any size, such as 128×1, 128×128, or other sizes. The size of the array depends on the size of each sensor cell 24, the target fingerprint scanner area, among other factors. The fingerprint sensor 20 further includes a controller 28 integrated with, or otherwise coupled to, the sensor cells 24. In an embodiment, the controller 28 is formed in the substrate 12 underneath the array of the sensor cells 24. In another embodiment, the controller 28 is formed in the same material layers where the sensor cells 24 are formed. The controller 28 is configured to collect capacitances detected by the sensor cells 24. The controller 28 may also be configured to program the sensor cells 24.

Still referring to FIG. 4, the sensor cells 24 are divided into multiple groups. In this example, there are eight groups, which are labeled as G1, G2, G3, G4, G5, G6, G7, and G8 for the convenience of discussion. In embodiments, there may be 8, 16, 32, or 64 groups, or another number of groups. In the embodiment shown, each group occupies a complete row of the array. More configurations of the sensor cells 24 will be shown and discussed in later sections. According to one aspect of the present disclosure, each group is associated with (or assigned) a unique group-identifiable signal 26. In the example shown in FIG. 4, there are eight group-identifiable signals. For the convenience of discussion, the eight group-identifiable signals are labeled as 26G1, 26G2, 26G3, 26G4, 26G5, 26G6, 26G7, and 26G8. All sensor cells 24 in one group transmit the group-identifiable signal of the respective group and receive the group-identifiable signals of the other groups. For example, a sensor cell 24 in the group G1 transmits the signal 26G1 and receives the signals 26G2~26G8.

In various embodiments, the group-identifiable signals may be in the frequency band of 10 kHz to 2 MHz, which is suitable for fingerprint sensor applications. In an embodiment, the group-identifiable signals are orthogonal with respect to each other. In one example, the group-identifiable signals may be setup according to the principles of orthogonal frequency-division multiplexing (OFDM). For example, the signals 26G1~26G8 may be OFDM signals have frequencies of 300, 320, 340, 360, 380, 400, 420, and 440 kHz respectively. In another example, the group-identifiable signals are code orthogonal. For example, the signals 26G1~26G8 may be modulated with the code (1, −1, 1, 1, 1, 1, 1, 1), (1, 1, −1, 1, 1, 1, 1, 1), . . . (1, 1, 1, 1, 1, 1, 1, −1), and (−1, 1, 1, 1, 1, 1, 1, 1) respectively. The orthogonal signals 26G1~26G8 enable the sensor cells 24 to simultaneously transmit and receive the respective signals. The orthogonal signals 26G1~26G8 also enhance the fingerprint sensor 20's sensing accuracy, particularly in a noisy environment. For example, noise may come from nearby environment having wireless signals such as 802.11 and Bluetooth, a switched-mode power supply, and the like. If one of the group-identifiable signals is affected by the noise, other group-identifiable signals can still be received and detected by the destination sensor cell. This provides better anti-interference capability in the fingerprint sensor 20 over traditional fingerprint sensors that use a single frequency AC signal.

Still referring to FIG. 4, in an embodiment, the controller 28 is configured to activate all sensor cells 24 to transmit and receive at the same time. This advantageously provides a fast frame rate. In a traditional approach, only one sensor cell or one row of sensor cells is active at a time. To scan the entire area of the fingerprint sensor 20 (referred to as one frame), if only one sensor cell is active at a time, it would take 64 times of single sensor cell response time. Assuming the single sensor cell response time is 1 micro-second (μs), the frame rate in the traditional approach would be 64 μs per frame. In contrast, the frame rate in the fingerprint sensor 20 according to the present disclosure is 1 μs per frame. Faster frame rate is generally desirable for fingerprint sensing applications. For example, at boarder entry-exit, a fast fingerprint sensor will help speed up the entry-exit program.

In an embodiment, the controller 28 includes a timer circuit for generating a trigger. Once the trigger is active, the controller 28 activates all sensor cells 24 and collects the capacitance responses from each thereof. Once the responses are collected, the controller 28 deactivates the sensor cells 24 to save power.

In an alternative embodiment, the controller 28 is configured to activate some of the sensor cells 24 to transmit and receive at the same time while other sensor cells are inactive, for reducing peak power consumption by the fingerprint sensor 20.

Figure 5:
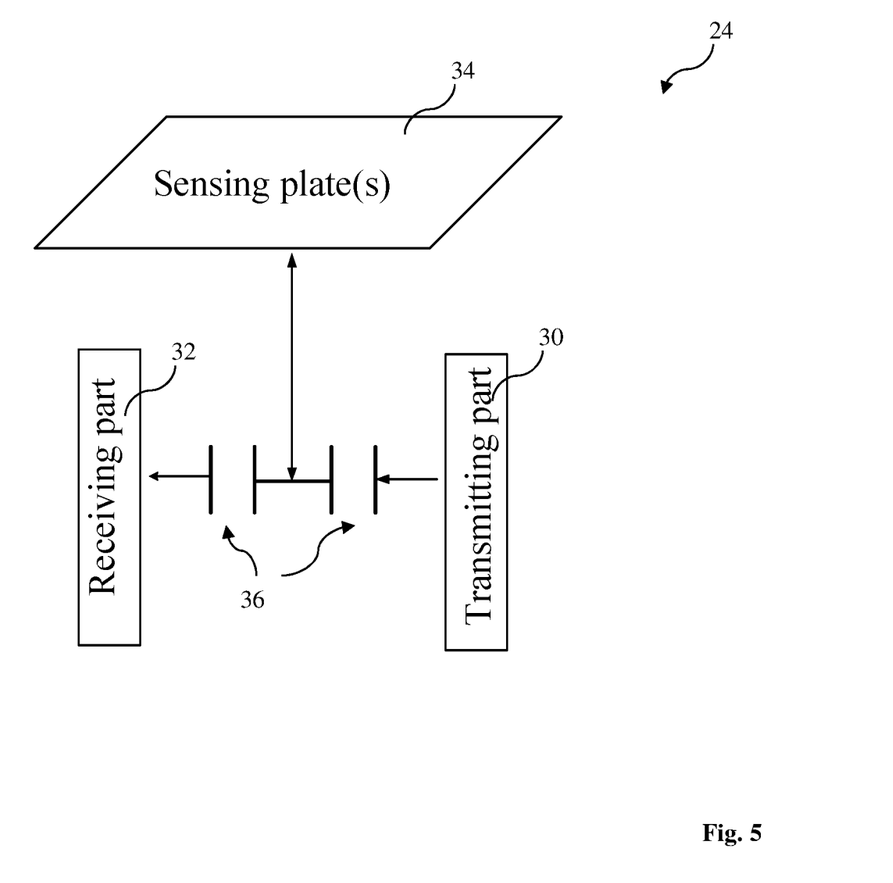
FIG. 5 is a schematic block diagram of a fingerprint sensor cell constructed in accordance with some embodiments of the present disclosure.

FIG. 5 illustrates a schematic view of a sensor cell 24, in portion, according to aspects of the present disclosure. Referring to FIG. 5, the sensor cell 24 comprises a transmitting part (or transmitter) 30, a receiving part (or receiver) 32, and a sensing plate (or antenna plate) 34 from which the sensor cell 24 transmits and receives signals. In an embodiment, the transmitter 30 and receiver 32 are formed with active and passive semiconductor devices. Active devices include transistors such as field effect transistors and bipolar transistors. Passive devices include resistors, capacitors, and inductors. The antenna plate 34 includes a metal such as aluminum, copper, other suitable metals, or a combination thereof. The antenna plate 34 may have a square, round, hexagon, or other shape. In one example, the antenna plate 34 has a round shape with a radius about 50 micron (μm). The sensor cell 24 further includes capacitors 36 to remove direct current (DC) contents from the transmitting and receiving signals. In the embodiment shown, the transmitter 30 and the receiver 32 share the same antenna plate 34. Because the transmitting and receiving signals are orthogonal as discussed above, sharing the antenna plate 34 does not create interference in the transmitter 30 and the receiver 32. Sharing the antenna plate 34 advantageously reduces the footprint of each sensor cell 24.

In an embodiment, the receiver 32 is configured to assign different weights to different group-identifiable signals that it receives. In a further embodiment, the different weights are a function of a distance between this sensor cell and the sensor cells that transmit the group-identifiable signals. For example, referring back to FIG. 4, the sensor cells 24 in the group G4 (or G4 sensor cells) may be configured to assign weights W1, W2, W3, W5, W6, W7, and W8 to the group-identifiable signals 26G1, 26G2, 26G3, 26G5, 26G6, 26G7, and 26G8, respectively. Further, based on the layout of the sensor cell array, the relative distances between the G4 sensor cells and the other sensor cells are predetermined. For example, a distance between G6 and G4 sensor cells is shorter than a distance between G8 and G4 sensor cells. Therefore, the receiver 32 of G4 sensor cells may assign a greater value to the weight W6 than the weight W8 because the signal 26G6 is more trustworthy, or less affected by environmental noises, than the signal 26G8.

According to an aspect of the present disclosure, the thickness of the protective layer 9 (FIG. 3) is also a factor for the design of the receiver 32. For example, when the protective layer 9 is thicker than a radius of the antenna plate 34, the signals 26 may be directly coupled from nearby sensor cells 24 to this sensor cell 24 through the protective layer 9 and without going through the finger 7 (FIG. 3). Such direct coupling may adversely affect the accuracy of the fingerprint sensing. In an embodiment, the receiver 32 of a sensor cell 24 can be configured to ignore the signals transmitted by nearby (e.g., immediately adjacent or immediately surrounding) sensor cells. For example, the G4 sensor cells can be configured to ignore the signals 26G3 and 26G5, for example, by assigning W3=0 and W5=0 in its receiver 32. In this case, the G3 and G5 sensor cells act as isolation features for the G4 sensor cells. However, this is different from a design where the G3 and G5 sensor cells are deactivated (set to idle) when the G4 sensor cells are receiving. In the present embodiment, even though the signal 26G3 is ignored by the G4 sensor cells, it is still received and used by the sensor cells in the groups G1, G5, G6, G7, and G8. Similarly, even though the signal 26G5 is ignored by the G4 sensor cells, it is still received and used by the sensor cells in the groups G1, G2, G3, G7, and G8. This advantageously provides isolation to the G4 sensor cells and, at the same time, enables simultaneous capacitance capture by the sensor cells in all groups G1~G8.

Figure 6:
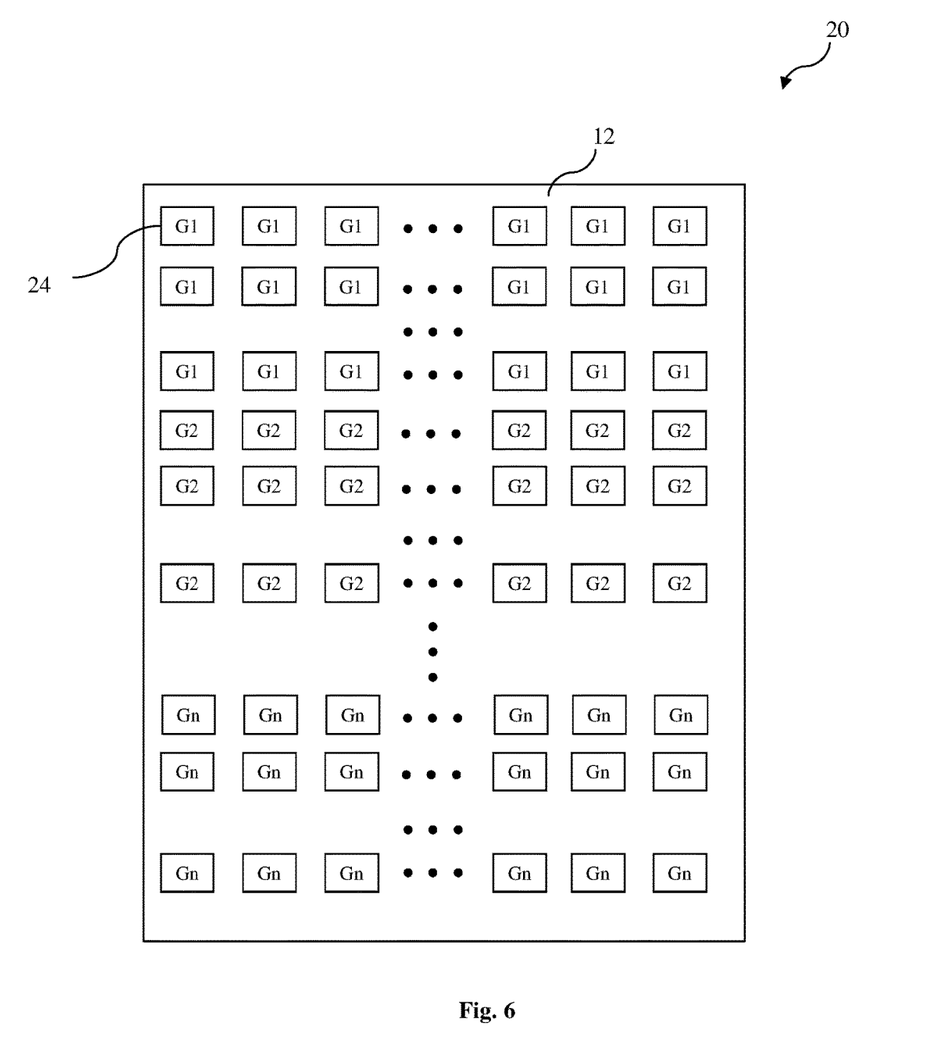
FIGS. 6, 7, 8, and 9 are top views of the fingerprint sensor in FIG. 3 constructed in accordance with some embodiments of the present disclosure.

FIGS. 6-9 illustrate various configurations of the sensor cells 24, in accordance with some embodiments of the present disclosure. Referring to FIG. 6, the sensor cells 24 are configured into an array of rows and columns of sensor cells. The sensor cells 24 are divided into "n" groups with each group associated with a group-identifiable signal, as discussed above. Further, each group comprises complete rows of sensor cells 24, and the sensor cells 24 belonging to the same group are placed into contiguous rows. For example, the sensor cells 24 in group G1 occupy the first several rows at the top of the page, followed by the sensor cells 24 in group G2. This pattern repeats for the remaining portions of the array. In embodiments, "n" may be 4, 8, 16, 32, 64, or any other integer suitable for the design of the fingerprint sensor 20.

Figure 7:
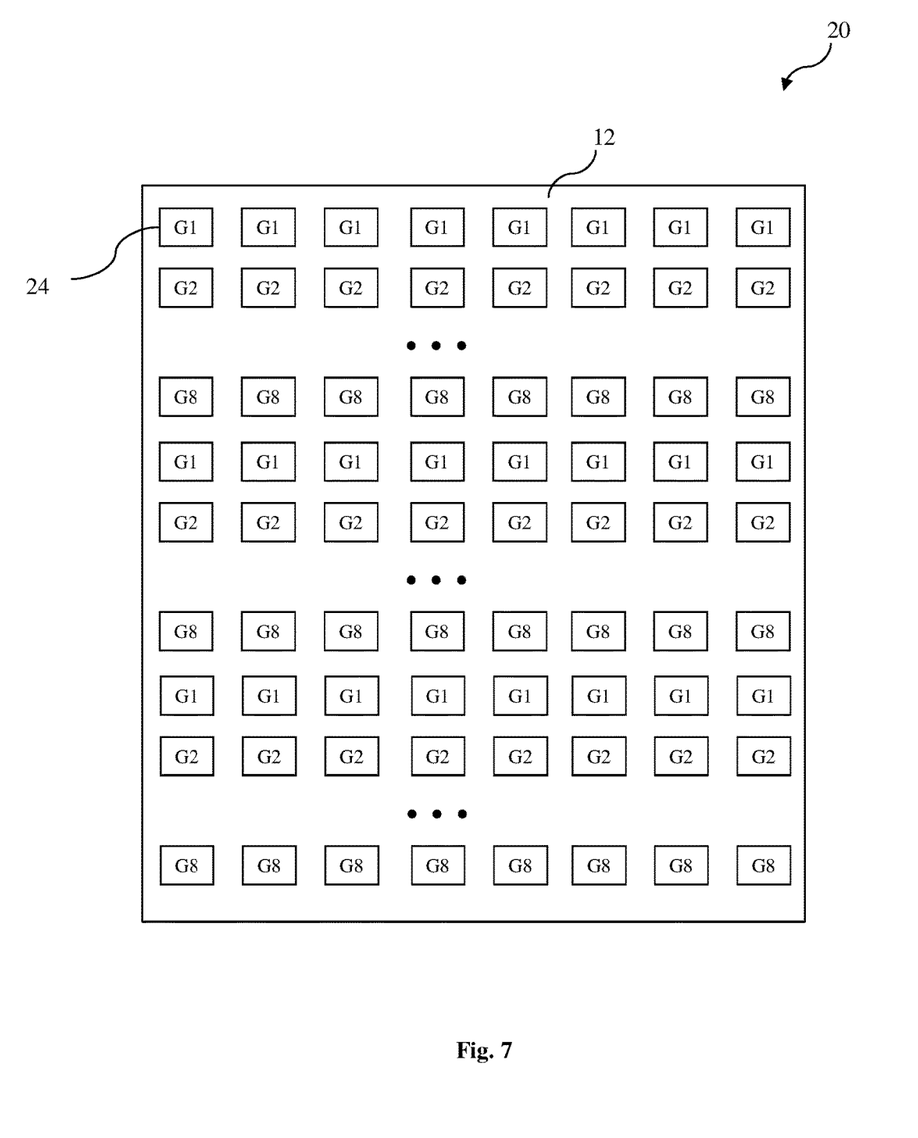

Referring to FIG. 7, the sensor cells 24 are configured into an array of rows and columns of sensor cells. The sensor cells 24 are divided into eight groups with each group associated with a group-identifiable signal, as discussed above. Further, each group comprises complete rows of sensor cells 24, and the sensor cells 24 belonging to the eight groups are arranged contiguously. For example, the first eight rows (beginning at the top of the page) of the sensor cells 24 belong to the eight groups G1, G2, . . . G8 respectively. Then this pattern repeats for the rest of the array. In an embodiment, the controller 28 is configured to activate first eight rows of the sensor cells 24 while keeping other sensor cells 24 inactive to reduce peak power consumption. Since the eight rows comprise sensor cells 24 from each group, all group-identifiable signals are available for capacitance measurements. It is noted that the eight groups in FIG. 7 are used for illustrative purposes. In various embodiments, the fingerprint sensor 20 may use any number of groups, such as 4, 16, 32, or 64.

Figure 8:
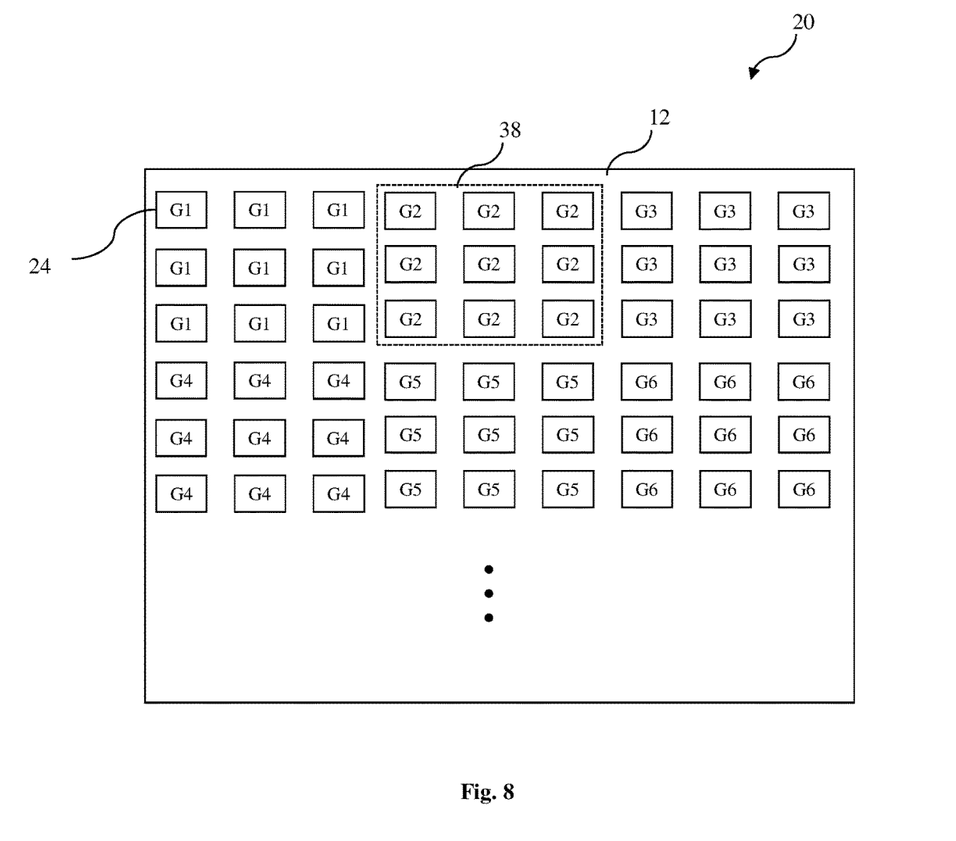

Referring to FIG. 8, the sensor cells 24 are configured into an array of rows and columns of sensor cells. The sensor cells 24 are divided into many groups (six groups shown) with each group associated with a group-identifiable signal, as discussed above. In this embodiment, each group in the fingerprint sensor 20 does not occupy a complete row. Instead, sensor cells 24 belonging to the same group are organized into small blocks. In the example shown in FIG. 8, sensor cells 24 in each group are organized into 3×3 square blocks. One such block 38 comprising nine G2 sensor cells is indicated with a dotted box in FIG. 8. In various embodiments, the sensor cells 24 in each group may be organized into 2×2, 2×3, 3×3, 4×4, . . . N×N, or N×M blocks. These blocks are placed into rows and columns, filling the scanning area of the fingerprint sensor 20 like a bigger-sized sensor cell. Further, a block belonging to a group is surrounded by blocks belonging to other groups.

Figure 9:
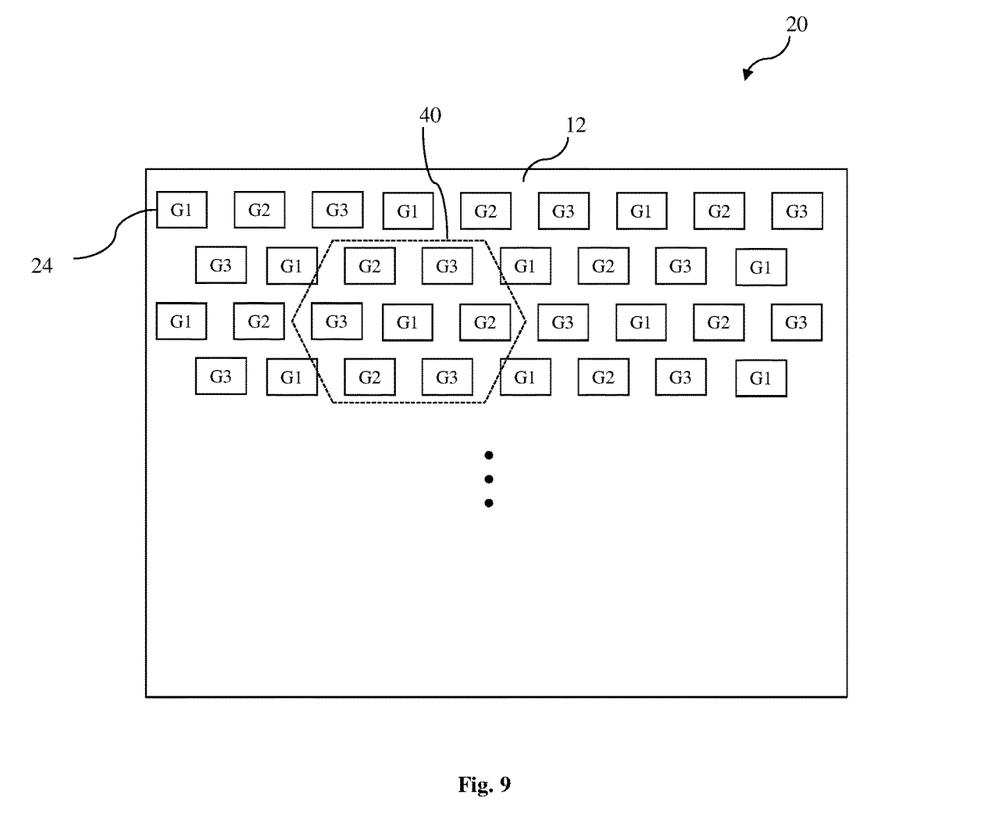

Referring to FIG. 9, according to another embodiment of the present disclosure, the sensor cells 24 are arranged into rows and with a cellular-like placement having many cellular blocks. One cellular block 40 having eight sensor cells 24 is indicated by a dotted hexagon in FIG. 9. In the cellular block 40, the center sensor cell is a G1 sensor cell, and the sensor cells surrounding the center sensor cell are from different groups, in this example, groups G2 and G3. This configuration provides for short signal paths among sensor cells, also may reduce the number of group-identifiable signals needed.

The present disclosure provides a fingerprint sensor device in various embodiments. The fingerprint sensor is free of bezel and each sensor cell is operable to function as an AC signal transmitting cell and at the same time receives AC signals transmitted by other sensor cells. Various embodiments of the present disclosure provide benefits of fast fingerprint capture frame rates, higher transmitting AC signal power, and better immunity to environmental noises.

The foregoing has outlined features of several embodiments. Persons having ordinary skill in the art will appreciate that the embodiments encompassed by the present disclosure are not limited to the particular exemplary embodiments described above. In that regard, although illustrative embodiments have been shown and described, a wide range of modification, change, and substitution is contemplated in the foregoing disclosure. It is understood that such variations may be made to the foregoing without departing from the scope of the present disclosure. Accordingly, it is appropriate that the appended claims be construed broadly and in a manner consistent with the present disclosure.

What is claimed is:

1. A fingerprint sensing device, comprising:
   a substrate; and
   an array of sensor cells formed over the substrate, wherein the sensor cells are divided into multiple groups; each group is associated with a group-identifiable signal; the sensor cells in each group are configured to transmit the group-identifiable signal of the respective group and are further configured to simultaneously receive the group-identifiable signals transmitted by the sensor cells in other groups; and the group-identifiable signals are orthogonal with respect to each other.

2. The fingerprint sensing device of claim 1, wherein the array of sensor cells comprise rows and columns of sensor cells, and each of the groups comprises complete rows of sensor cells.

3. The fingerprint sensing device of claim 2, wherein the complete rows of sensor cells belonging to a same group are arranged contiguously.

4. The fingerprint sensing device of claim 2, wherein the complete rows of sensor cells belonging to different groups are arranged contiguously.

5. The fingerprint sensing device of claim 1, wherein a sensor cell belonging to a first group is surrounded by sensor cells belonging to groups different from the first group.

6. The fingerprint sensing device of claim 1, wherein the array of sensor cells comprise rows and columns of sensor cells, and each of the groups is arranged into one or more N×M blocks of sensor cells, wherein each of N and M is an integer less than the number of sensor cells in a row and less than the number of sensor cells in a column.

7. The fingerprint sensing device of claim 1, wherein the group-identifiable signals are orthogonal frequency-division multiplexing (OFDM) signals.

8. The fingerprint sensing device of claim 1, wherein a sensor cell is configured to assign different weights to the group-identifiable signals that it receives from the sensor cells of the other groups.

9. The fingerprint sensing device of claim 1, wherein a sensor cell is configured to ignore the group-identifiable signals that are transmitted by sensor cells that immediately surround the sensor cell.

10. The fingerprint sensing device of claim 1, further comprising a controller integrated with the sensor cells, and designed to collect capacitances reported by the sensor cells.

11. A fingerprint sensing device, comprising:
    a substrate;
    an array of sensor cells formed over the substrate; and
    a controller integrated with the sensor cells, and designed to collect capacitances sensed by the sensor cells, wherein:
    the sensor cells are divided into multiple groups;
    the sensor cells in each group are configured to transmit a group-identifiable signal and to receive group-identifiable signals transmitted by the sensor cells of other groups;
    each sensor cell is configured to assign different weights to the group-identifiable signals that it receives from the sensor cells of the other groups based on a distance between this sensor cell and the sensor cells of the other groups; and
    the group-identifiable signals are orthogonal in frequency or in code.

12. The fingerprint sensing device of claim 11, wherein a sensor cell is configured to ignore the group-identifiable signals that are transmitted by sensor cells that surround the sensor cell.

13. The fingerprint sensing device of claim 11, wherein a sensor cell belonging to a first group is surrounded by sensor cells belonging to groups different from the first group.

14. The fingerprint sensing device of claim 11, wherein each of the groups is arranged into one or more N×M blocks of sensor cells, and wherein an N×M block belonging to a group is surrounded by N×M blocks belonging to other groups.

15. The fingerprint sensing device of claim 11, wherein each of the groups comprises complete rows of sensor cells, and wherein rows of sensor cells belonging to different groups are arranged contiguously.

16. The fingerprint sensing device of claim 15, wherein the controller is configured to activate N rows of sensor cells at a time, wherein N is the number of the groups.

17. A fingerprint sensing device, comprising:
a substrate;
an array of sensor cells formed over the substrate and configured into rows and columns, and
a controller integrated with the sensor cells, and designed to collect capacitances detected by the sensor cells, wherein:
the sensor cells are divided into multiple groups and each group is associated with a group-identifiable signal;
each sensor cell comprises an antenna plate, a transmitter, and a receiver;
the transmitter is configured to transmit the respective group-identifiable signal through the antenna plate;
the receiver is configured to receive group-identifiable signals from other sensor cells through the antenna plate;
the receiver is further configured to assign different weights to the group-identifiable signals that it receives based on a distance between this sensor cell and the transmitting sensor cells; and
the group-identifiable signals are orthogonal.

18. The fingerprint sensing device of claim 17, wherein each of the groups comprises complete rows of sensor cells, and wherein rows of sensor cells belonging to a same group are arranged contiguously.

19. The fingerprint sensing device of claim 17, wherein each of the groups comprises complete rows of sensor cells, and wherein rows of sensor cells belonging to different groups are arranged contiguously.

20. The fingerprint sensing device of claim 19, wherein the controller is configured to activate all sensor cells to transmit and receive at the same time.

* * * * *